US 9,468,109 B2

(12) United States Patent
Suzuki et al.

(10) Patent No.: US 9,468,109 B2
(45) Date of Patent: Oct. 11, 2016

(54) METHOD FOR FABRICATING WIRING BOARD

(71) Applicant: Panasonic Intellectual Property Management Co., Ltd., Osaka (JP)

(72) Inventors: Fumito Suzuki, Osaka (JP); Takehiro Ishida, Fukushima (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/896,960

(22) PCT Filed: Jun. 24, 2015

(86) PCT No.: PCT/JP2015/003167
§ 371 (c)(1),
(2) Date: Dec. 9, 2015

(87) PCT Pub. No.: WO2016/006185
PCT Pub. Date: Jan. 14, 2016

(65) Prior Publication Data
US 2016/0205789 A1    Jul. 14, 2016

(30) Foreign Application Priority Data

Jul. 8, 2014    (JP) ................. 2014-140728

(51) Int. Cl.
*B32B 37/00*    (2006.01)
*H05K 3/46*    (2006.01)

(52) U.S. Cl.
CPC ....... *H05K 3/4673* (2013.01); *H05K 2203/066* (2013.01)

(58) Field of Classification Search
CPC ............. H05K 3/4673; H05K 3/4626; H05K 3/4647; H05K 3/4655; C08J 5/24; B23B 37/182; B29C 66/723; B29C 66/7352; B29C 66/73521; B29C 66/73753
USPC .......................................... 156/307.1–307.7
See application file for complete search history.

(56) References Cited

U.S. PATENT DOCUMENTS

| 5,352,762 A * | 10/1994 | Nagai ................. H05K 1/0346 428/411.1 |
| 2009/0302462 A1* | 12/2009 | Hosomi ................... B32B 5/26 257/734 |
| 2011/0180208 A1* | 7/2011 | Tachibana ............... B32B 37/16 156/285 |

FOREIGN PATENT DOCUMENTS

| JP | 2005-183800 | 7/2005 |
| JP | 2008-081556 | 4/2008 |
| JP | 2009-019150 | 1/2009 |
| JP | 2009-173726 | 8/2009 |
| JP | 2010-272880 | 12/2010 |

OTHER PUBLICATIONS

International Search Report of PCT application No. PCT/JP2015/003167 dated Sep. 29, 2015.

* cited by examiner

*Primary Examiner* — John Goff
(74) *Attorney, Agent, or Firm* — McDermott Will & Emery LLP

(57) ABSTRACT

A core material is prepared, wherein the core material has an insulating layer, and a conductor pattern provided on a surface of the insulating layer. One or more prepreg materials are prepared. Each prepreg material includes a glass cloth, and first and second resin layers which are formed from a semi-cured resin with which the glass cloth is impregnated, and cover the opposite surfaces of the glass cloth, respectively. A laminated body is formed by placing the one or more prepreg materials on one another, such that one prepreg material out of the one or more prepreg materials is provided on the surface of the insulating layer of the core material to cover the conductor pattern. The laminated body is heated and pressed. The glass cloth has an opening ratio ranging from 3% to 15%. The thickness t of the first and second resin layers, the ratio a (%) of the area of the conductor pattern to the area of the surface of the insulating layer in the core material, the thickness T of the conductor pattern, and the number n of the one or more prepreg materials satisfy the relationships: $T \geq 100$ ($\mu$m): and $t < (1-a/100) \cdot T < 2 \cdot n \cdot t$.

6 Claims, 6 Drawing Sheets

FIG. 4A

| | Example 1 | Example 2 | Example 3 | Example 4 | Example 5 | Example 6 | Example 7 | Example 8 |
|---|---|---|---|---|---|---|---|---|
| Cloth Style of Glass Cloth 1 | 1080 | 1080 | 1080 | 1080 | 106 | 106 | 106 | 106 |
| Opening rate of Glass Cloth 1 (%) | 4.3 | 4.3 | 4.3 | 4.3 | 12.5 | 12.5 | 12.5 | 12.5 |
| Amount of Resin in Prepreg Material 2 (weight %) | 69 | 69 | 50 | 50 | 72 | 85 | 85 | 85 |
| Number of Prepreg Materials 2 | 3 | 8 | 6 | 10 | 14 | 3 | 6 | 10 |
| Total Thickness of Prepreg Materials 2 (mm) | 0.28 | 0.74 | 0.45 | 0.75 | 0.76 | 0.22 | 0.44 | 0.73 |
| Thickness of One Prepreg Material (mm) | 0.093 | 0.093 | 0.075 | 0.075 | 0.055 | 0.073 | 0.073 | 0.073 |
| Thickness of Glasss Cloth 1 (mm) | 0.055 | 0.055 | 0.055 | 0.055 | 0.035 | 0.035 | 0.035 | 0.035 |
| Thickness of Reswin Layer 5 (mm) | 0.019 | 0.019 | 0.010 | 0.010 | 0.010 | 0.019 | 0.019 | 0.019 |
| Voids | None | None | None | None | None | None | None | None |

FIG. 4B

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Cloth Style of Glass Cloth 1 | 7628 | 7628 | 7628 | 2116 | 2116 | 2116 | 1080 |
| Opening rate of Glass Cloth 1 (%) | 0.6 | 0.6 | 0.6 | 1.5 | 1.5 | 1.5 | 4.3 |
| Amount of Resin in Prepreg Material 2 (weight %) | 52 | 52 | 52 | 60 | 60 | 60 | 50 |
| Number of Prepreg Materials 2 | 1 | 2 | 3 | 2 | 3 | 5 | 2 |
| Total Thickness of Prepreg Materials 2 (mm) | 0.24 | 0.48 | 0.73 | 0.31 | 0.47 | 0.77 | 0.15 |
| Thickness of One Prepreg Material (mm) | 0.24 | 0.24 | 0.24 | 0.155 | 0.155 | 0.155 | 0.075 |
| Thickness of Glasss Cloth 1 (mm) | 0.18 | 0.18 | 0.18 | 0.095 | 0.095 | 0.095 | 0.055 |
| Thickness of Reswin Layer 5 (mm) | 0.030 | 0.030 | 0.030 | 0.030 | 0.030 | 0.030 | 0.010 |
| Voids | Yes | Yes | Yes | Yes | Yes | Yes | Yes |

METHOD FOR FABRICATING WIRING BOARD

This application is a U.S. national stage application of the PCT international application No. PCT/JP2015/003167 filed on Jun. 24, 2015, which claims the benefit of foreign priority of Japanese patent application 2014-140728 filed on Jul. 8, 2014, the contents all of which are incorporated herein by reference.

TECHNICAL FIELD

The present invention relates to a method for fabricating a wiring board.

BACKGROUND ART

Wiring boards have been used in various applications, and increasingly demanded to be adaptable to larger electric currents and higher voltages in the cases where they are used in vehicle-mounted applications, along with recent wide spread of electric automobiles and hybrid automobiles. Therefore, for coping with such larger electric currents and higher voltages, conductor patterns as inner-layer patterns need to have larger thicknesses more than, e.g. 100 μm. Gaps between the conductor patterns are filled with a resin in a prepreg material (see PTL 1 and PTL2).

CITATION LIST

Patent Literatures

PTL 1: Japanese Patent Laid-Open Publication No. 2008-81556
PTL 2: Japanese Patent Laid-Open Publication No. 2009-19150

SUMMARY

A core material includes an insulating layer and a conductor pattern provided on a surface of the insulating layer. One or more prepreg materials are prepared. Each prepreg material includes a glass cloth and first and second resin layers made of a semi-cured resin with which the glass cloth is impregnated, and covers the opposite surface of the glass cloth. A laminated body is formed by placing the one or more prepreg materials on one another, such that one prepreg material out of the one or more prepreg materials is provided on the surface of the insulating layer of the core material to cover the conductor pattern. The laminated body is heated and pressed. The glass cloth has an opening ratio ranging from 3% to 15%. A thickness t of the first and second resin layers, a ratio a (%) of an area of the conductor pattern to an area of the insulating layer of the core material, a thickness T of the conductor pattern, and the number n of the one or more prepreg materials satisfy the relationships: $T \geq 100$ (μm); and $t<(1-a/100) \cdot T<2 \cdot n \cdot t$.

This fabricating method can fill a gap between the conductor patterns having a thickness more than 100 μm with the resin while suppressing voids produced therein. Further, it can suppress protrusions of the resin from the periphery of the laminated body during the heating-and-pressing of the laminated body constituted by the core material and the prepreg materials. This can provide a wiring board having a small thickness.

BRIEF DESCRIPTION OF DRAWINGS

FIG. 4A is a table illustrating results of evaluation of the wiring board according to Embodiment 2.

FIG. 4B is a table illustrating results of evaluation of a comparative example of a wiring board.

DETAIL DESCRIPTION OF PREFERRED EMBODIMENTS

Exemplary Embodiment 1

Figure 1A:
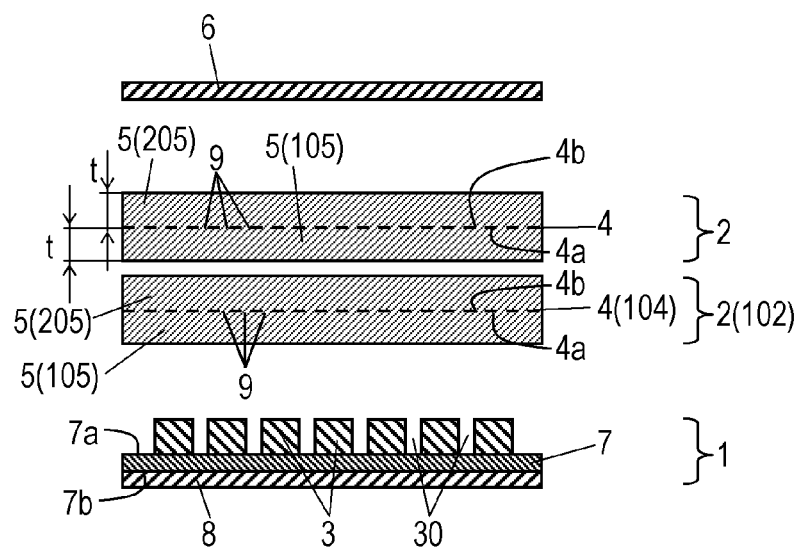
FIG. 1A is a schematic cross-sectional view of a wiring board according to Exemplary Embodiment 1 for illustrating a process in a method for fabricating the wiring board.
Figure 1B:
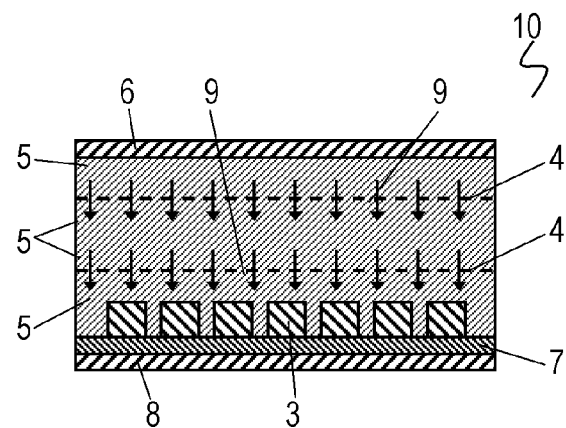
FIG. 1B is a schematic cross-sectional view of the wiring board according to Embodiment 1 for illustrating a process in the method for fabricating the wiring board.
Figure 1C:
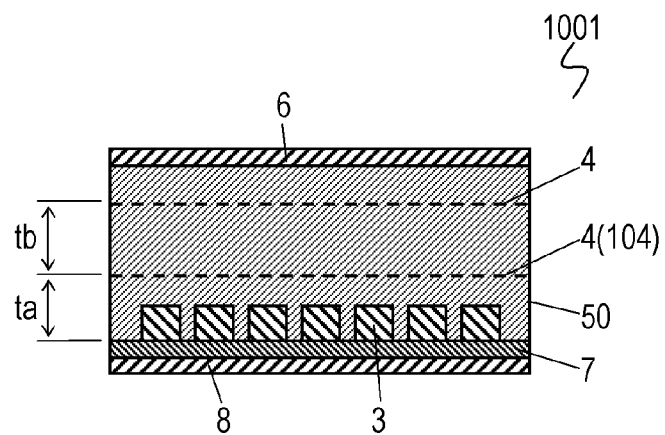
FIG. 1C is a schematic cross-sectional view of the wiring board according to Embodiment 1 for illustrating a process in the method for fabricating the wiring board.

FIGS. 1A to 1C are cross-sectional views of wiring board 1001 according to Exemplary Embodiment 1 for illustrating processes in a method for fabricating wiring board 1001. First, core material 1 and prepreg materials 2 which are materials of wiring board 1001 will be described.

Core material 1 is formed by placing conductor patterns 3 on one surface 7a of insulating layer 7. Insulating layer 7 has an electrical insulating property. Conductor patterns 3 have a thickness T1 not smaller than 100 μm. Conductor patterns 3 have a large thickness T1 can easily treat a larger electric current and a high voltage. The upper limit of the thickness T1 of conductor patterns 3 is, e.g. 1000 μm, which is not particularly limited. Metal foil 8 may be provided entirely on surface 7b of insulating layer 7 opposite to surface 7a. Insulating layer 7 has a thickness ranging, e.g. from 0.02 mm to 3.0 mm, but the thickness thereof is not particularly limited. Metal foil 8 has a thickness ranging, e.g. from 12 μm to 1000 μm, but the thickness is not particularly limited. Insulating layer 7 is made of an insulating resin, such as an epoxy resin, which is not particularly limited. Insulating layer 7 may include a base material, such as a glass cloth. The material of conductor patterns 3 is, e.g. copper, and metal foil 8 is a copper foil, for example, but they are not particularly limited. Core material 1 described above can be provided by forming patterns by etching a single surface of a commercially available double-sided metal clad laminated plate.

Prepreg materials 2 are formed by impregnating glass cloth 4 with a resin and semi-curing the resin.

Figure 2:
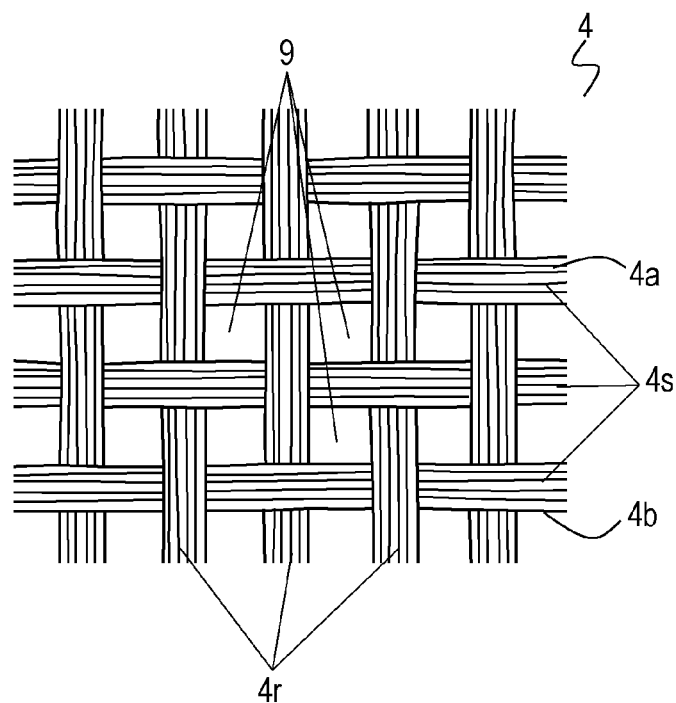
FIG. 2 is a schematic enlarged plan view of a glass cloth of the wiring board according to Embodiment 1.

FIG. 2 is a schematic enlarged plan view of glass cloth 4. Glass cloth 4 may be a cloth constituted by warps 4r and wefts 4s which are made of glass fibers. Warps 4r and wefts 4s are woven with each other, as illustrated in FIG. 2. Warps 4r adjacent to each other and wefts 4s adjacent to each other surround plural openings 9, which are so-called basket holes. The way of weaving of glass cloth 4 is plain weave, for example, but is not particularly limited. Glass cloth 4 has an opening ratio ranging from 3% to 15%. The opening ratio of glass cloth 4 refers to the ratio of a total area of plural openings 9 to a total area of surface 4a (4b) of glass cloth 4 (which also includes the total area of openings 9), which is expressed as a percentage viewing in the thickness direction as shown in FIG. 2 in a plan view). The opening ratio of glass cloth 4 smaller than 3% decreases the amount of the resin which moves from one of surfaces 4a and 4b of glass cloth 4 to the other surface. The opening ratio of glass cloth 4 is larger greater than 15% degrades the strength of glass cloth 4 and degrades its resin-impregnation property. Further, in the case where wiring board 1001 is perforated through drilling or laser processing to make holes therein, the hole diameters may fluctuate or the hole inner walls have large roughness. Glass cloth 4 preferably has a thickness ranging from 10 µm to 100 µm. Glass cloth 4 having a thickness larger than 10 µm or more can suppress degradation of the strength of glass cloth 4. Glass cloth 4 having a thickness smaller than 100 µm can easily reduce the thickness of wiring board 1001.

The aforementioned resin refers to a resin composition prepared by adding a curing agent, a curing accelerator, a filler or other additives, as required, to a thermosetting resin, such as an epoxy resin, but the aforementioned resin is not particularly limited.

Prepreg materials 2 further include resin layers 5 (105, 205) made of a resin in a semi-cured state (B stage state) which are provided on surfaces 4a and 4b of glass cloth 4 opposite to each other. Each of resin layers 5 (105, 205) at the sides of prepreg materials 2 preferably has a thickness t ranging from 5 µm to 30 µm. The thickness t of resin layers 5 not smaller than 5 µm can suppress shortage of the resin filling gap 30 between conductor patterns 3. The thickness t of resin layers 5 not larger than 30 µm can easily reduce the thickness of wiring board 1001. Each of prepreg materials 2 preferably has an entire thickness ranging from 20 µm to 160 µm. The entire thickness of each of prepreg materials 2 is the sum of the thickness of glass cloth 4, the thickness t of resin layer 105 and the thickness t of resin layer 205. The entire thickness of each of prepreg materials 2 not smaller than 20 µm can suppress degradation of the strength of wiring board 1001. The entire thickness of one prepreg material 2 not larger than 160 µm can easily reduce the thickness of wiring board 1001. The amount of the resin constituting resin layers 5 of each of prepreg materials 2 ranges from 50 weight % to 85 weight %. The amount of the resin in each of prepreg materials 2 refers to the ratio of the weight of the resin to the total weight of prepreg material 2 including the weight of glass cloth 4, which is expressed as a percentage. The amount of the resin in each of prepreg materials 2 not smaller than 50 weight % can avoid shortage of the resin filling gap 30 between conductor patterns 3. The amount of the resin in each of prepreg materials 2 not larger than 85 weight % can suppress the protrusion of the resin from the periphery of laminated body 10 during heating-and-pressing forming of laminated body 10 including core material 1 and prepreg materials 2 which are placed on one another A method for fabricating wiring board 1001 according to Embodiment 1 will be described below. Wiring board 1001 can be fabricated by placing core material 1 and one or more prepreg materials 2 on one another, and heating-and-pressing them. According to Embodiment 1, a method using two prepreg materials 2 and further using metal foil 6 will be described. The number of prepreg materials 2 is not particularly limited, as long as it is equal to or more than one.

Metal foil 6 is, e.g. a copper foil, and has a thickness ranging, e.g. from 12 µm to 1000 µm.

First, as illustrated in FIG. 1A, core material 1, two prepreg materials 2 and metal foil 6 are stacked in this order. In this case, core material 1 has conductor patterns 3 provided on surfaces of the core material on which prepreg materials 2 are placed on, namely surface 7a of insulating layer 7. Conductor patterns 3 have a thickness T not smaller than 100 µm, According to Embodiment 1, the following relational expression (1) is satisfied.

$$t < (1-a/100) \cdot T < 2 \cdot n \cdot t \qquad (1)$$

In the relational expression (1), "t," "a," "T" and "n" are defined as follows.

t: The thickness of resin layer 5 (105, 205) in each single side of each of prepreg materials 2

As described above, the thickness t of resin layer 5 in each single side of each of prepreg materials 2 preferably ranges from 5 µm to 30 µm. Further, the thicknesses of resin layers 105 and 205 may be different from each other within a slight variation and are substantially equal to each other.

a(%): The ratio of the area of conductor patterns 3 to the area of core material 1

The areas refer to the areas in a plan view from the thickness direction of core material 1, namely in the direction facing surface 7a of insulating layer 7. Particularly in the case that the material of conductor patterns 3 is copper, the ratio a is referred to as a remaining copper rate. Further, the value of the expression (1−a/100) means the ratio of the area of gap 30 to the area of surface 7a of insulating layer 7 of core material 1.

T: The thickness of conductor patterns 3 (T≥100 µm)

As described above, the thickness T of conductor patterns 3 is not smaller than 100 µm.

n: The number of prepreg materials 2

The number n of prepreg materials 2 is two in wiring board 1001 illustrated in FIG. 1A, but it is not particularly limited as long as the relational expression (1) is satisfied.

Next, as illustrated in FIG. 1B, one prepreg material 2 (102) out of one or more prepreg materials 2 is placed on surface 7a of insulating layer 7 of core material 1 to cover conductor patterns 3. One or more prepreg materials 2 are placed on one another to form laminated body 10, such that one prepreg material 2 (102) out of one or more prepreg materials 2 is provided on a surface, such as a surface of metal foil 6, having substantially no raggedness. Laminated body 10 including core material 1, prepreg materials 2, and metal foil 6 is heated, pressed, and shaped to provide wiring board 1001 illustrated in FIG. 1C. In this case, the forming conditions, such as a temperature and a pressure, are not particularly limited.

In the aforementioned conventional wiring board, as the thickness of the conductor patterns is large, the gap between the conductor patterns have a large depth, which may cause shortage of the resin of the prepreg materials for filling the gap, so that the gap between the conductor patterns may be insufficiently filled with the resin. The shortage increases the possibility of occurrence of voids (air bubbles).

In order to suppress the occurrence of voids, it is possible to contrive use of prepreg materials having a larger amount of resin or use of a lot of the prepreg materials. However, in this case, the entire thickness of the wiring board becomes large against the trend toward thickness reduction.

Further, during heating-and-pressurizing forming in cases of fabricating such a conventional wiring board, it is possible to contrive bringing the cured state of the resin in the prepreg materials closer to the A stage for prolonging the curing time, increasing the temperature rise rate, or heightening the pressure. However, this necessitates special prepreg materials in cured states, which have no general versatility. This further involves special forming conditions, which is unsuitable for mass production.

Further, with the prepreg materials in such a conventional wiring board, only the resin in the side facing the conductor patterns is used for filling the gaps between the conductor patterns, which causes the resin in the side which does not face the conductor patterns to protrude aside during the heating-and-pressing forming, thereby degrading the yield.

In wiring board 1001 according to Embodiment 1, the resin of resin layers 5 in the semi-cured state in prepreg materials 2 comes into a molten state through the heating and pressing. It may be impossible to fill gap 30 between conductor patterns 3 only with the resin in resin layer 5 (105) facing core material 1 of prepreg material 2 adjacent to core material 1. According to Embodiment 1, glass cloths 4 in prepreg materials 2 have an opening ratio ranging from 3% to 15%. Thus, as indicated by arrows in FIG. 1B, the resin of resin layers 5 (205) which does not face core material 1 can move toward core material 1 through plural openings 9 in glass cloths 4. This can supply the resin from resin layer 5 (205) which does not face core material 1 enough to fill gap 30 between conductor patterns 3. Further, in the case that it is impossible to overcome the shortage of the resin only with prepreg material 2 adjacent to core material 1, it is also possible to move the resin from prepreg material 2 which is not adjacent to core material 1 toward core material 1, as indicated by the arrows in FIG. 1B, thereby supplying the resin thereto. Thus, it is possible to fill gap 30 between conductor patterns 3 having a thickness not smaller than 100 μm with the resin while suppressing the occurrence of voids. Further, the resin of resin layers 5 which do not face core material 1 can also be used for filling gap 30 between conductor patterns 3. This can avoid excessive increases of the amount of the resin in entire prepreg materials 2, thereby preventing the protrusion of the resin from the periphery of laminated body 10 during the heating-and-pressing forming of laminated body 10.

In the aforementioned relational expression (1), "t<(1−a/100)·T," the left-side inequality indicates that it is impossible to fill gap 30 between conductor patterns 3 only with the resin of the thickness t of resin layer 5 at a single side of one prepreg material 2.

In the aforementioned relational expression (1), "(1−a/100)·T<2·n·t," the right-side inequality indicates that it is possible to fill gap 30 between conductor patterns 3 with the resin of to the sum (2·n·t) of the thicknesses of resin layers 5 at both the sides of all prepreg materials 2.

By satisfying the aforementioned relational expression (1), it is possible to reduce the entire thickness of wiring board 1001, using prepreg materials 2 having a small thickness to such an extent that gap 30 between conductor patterns 3 can not be filled with the resin of resin layer 5 in a single side of prepreg material 2 adjacent to core material 1.

Particularly, glass cloths 4 of prepreg materials 2 preferably have a thickness ranging from 10 μm to 100 μm, resin layers 5 at the sides of prepreg materials 2 have a thickness t ranging from 5 μm to 30 μm, and each of prepreg materials 2 has an entire thickness ranging from 20 μm to 160 μm. This effectively reduces the entire thickness of wiring board 1001.

If the amount of the resin of prepreg materials 2 is increased, namely if the thicknesses t of resin layers 5 (105, 205) are increased, the cured state of the resin can hardly controlled, and may cause the resin to fall, thereby causing prepreg materials 2 to adhere to rollers in a drying line or a carrying line. This may prevent wiring board 1001 from being fabricated stably. If prepreg materials 2 adhere to the fabrication lines, the resin is partially exfoliated therefrom, which induces, e.g. streaks, raggedness, and non-uniformity of the resin in prepreg materials 2, thereby damaging their external appearance. This makes it impossible to maintain their quality high. Further, resin layers 105 and 205 on surfaces 4a and 4b of glass cloths 4 may have thicknesses largely different from each other, hence causing glass cloths 4 to deviate from the centers of prepreg materials 2.

In wiring board 1001 illustrated in FIG. 1C, the distance to surface 7a of insulating layer 7 in core material 1 from glass cloth 4 (104) of one prepreg material 2 (102) out of one or more (two) prepreg materials 2 which is provided on core material 1 and faces core material 1 is a thickness ta. The thickness ta is formed by one resin layer 5 (105), as illustrated in FIG. 1A. The distance between glass cloths 4 of two prepreg materials 2 is a thickness tb. The thickness tb is formed by two insulating layers 5 (105, 205). After laminated body 10 is pressed, the thickness ta is larger than a half of the thickness tb.

In wiring board 1001 illustrated in FIG. 1C, resin layers 5 in the semi-cured state in prepreg materials 2 are cured to form cured resin layer 50 having an insulating property. Conductor patterns 3 form inner-layer patterns embedded inside cured resin layer 50. Circuit patterns may be formed in metal foils 6 and 8 which are the outermost layers, by, e.g. a subtractive method.

Exemplary Embodiment 2

Figure 3A:
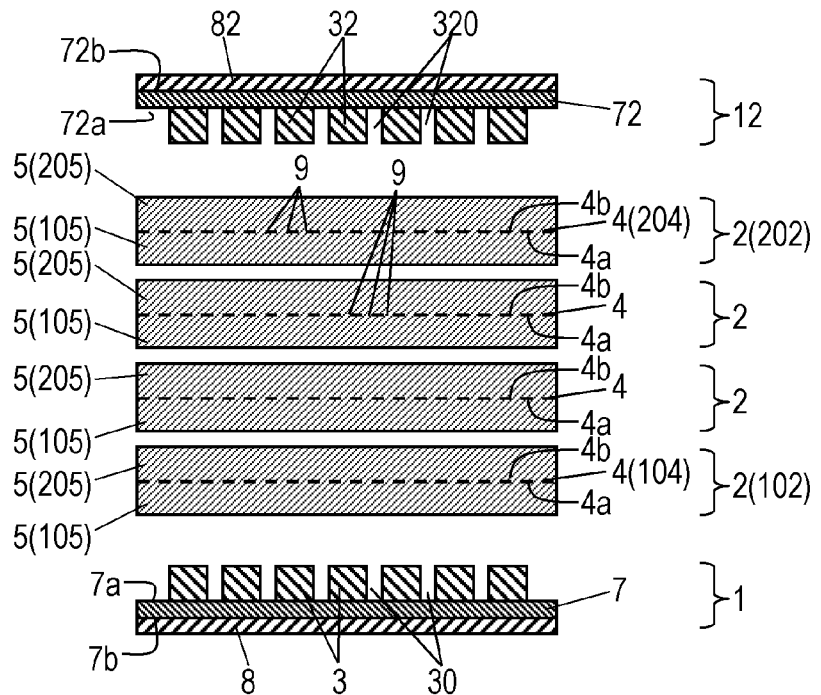
FIG. 3A is a schematic cross-sectional view of a wiring board according to Exemplary Embodiment 2 for illustrating a process in a method for fabricating the wiring board.
Figure 3B:
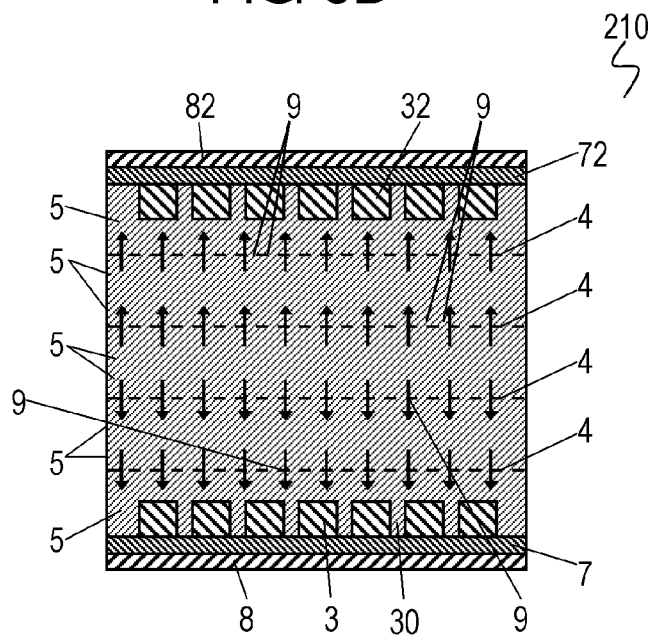
FIG. 3B is a schematic cross-sectional view of the wiring board according to Embodiment 2 for illustrating a process in the method for fabricating the wiring board.
Figure 3C:
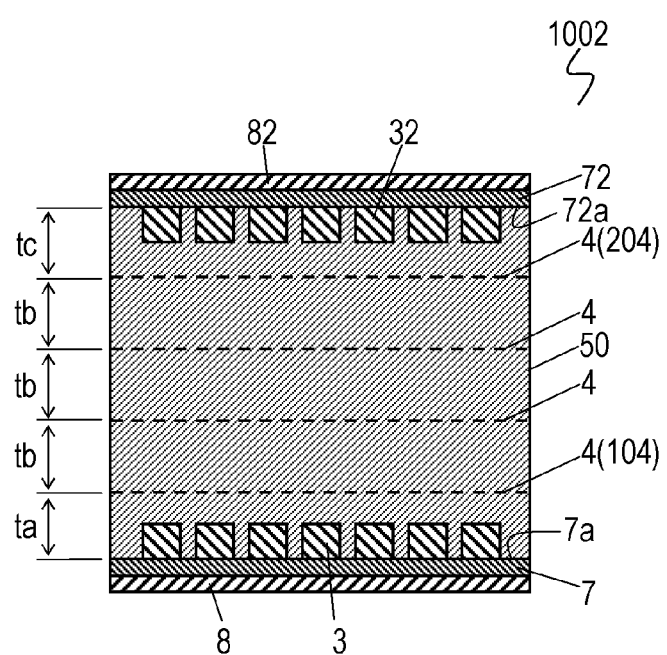
FIG. 3C is a schematic cross-sectional view of the wiring board according to Embodiment 2 for illustrating a process in a method for fabricating the wiring board.

FIGS. 3A to 3C are cross-sectional views of wiring board 1002 according to Exemplary Embodiment 2 for illustrating processes in a method for fabricating wiring board 1002. In FIGS. 3A to 3C, components identical to those of wiring board 1001 illustrated in FIGS. 1A to 1C are denoted by the same reference numerals. Wiring board 1002 includes core material 12 instead of metal foil 6 of wiring board 1001 according to Embodiment 1.

Core material 12 is formed similarly to core material 1. In other words, core material 12 includes insulating layer 72, conductor patterns 32, and metal foil 8 which correspond to insulating layer 7, conductor patterns 3, and metal foil 82 of core material 1, respectively. Core material 12 is constituted by insulating layer 72 having an electrical insulating property, and conductor patterns 32 provided on one surface 72a of insulating layer 72. Conductor patterns 32 have a thickness T2 not smaller than 100 μm. Metal foil 82 may be provided entirely on surface 72b of insulating layer 72 opposite to surface 72a.

A method for fabricating wiring board 1002 according to Embodiment 2 will be described below. Wiring board 1002 can be fabricated by stacking core material 1, plural prepreg materials 2, and core material 12 in this order, and performing heating-and-pressing forming thereto. According to Embodiment 2, A case of using four prepreg materials 2 will be described, but the number of prepreg materials 2 is not particularly limited, as long as it is equal to or more than two.

First, as illustrated in FIG. 3A, core material 1, four prepreg materials 2, and core material 12 are stacked in this order. In this case, conductor patterns 3 having a thickness T1 not smaller than 100 μm are formed on surface 7a of insulating layer 7 of core material 1 on which prepreg material 2 is placed. Conductor patterns 32 having a thickness T2 not smaller than 100 μm are formed on surface 72a of insulating layer 72 of core material 12 on which prepreg material 2 is placed.

According to Embodiment 2, the following relational expressions (2) to (4) are all satisfied.

$$t<(1-a1/100)\cdot T1 \quad (2)$$

$$t<(1-a2/100)\cdot T2 \quad (3)$$

$$(1-a1/100)\cdot T1+(1-a2/100)\cdot T2<2\cdot n\cdot t \quad (4)$$

In the aforementioned relational expressions (2) to (4), "t," "a1," "a2," "T1", "T2," and "n" are defined as follows.

t: The thickness of resin layer 5 at one side of each of prepreg materials 2

Similarly to Embodiment 1, resin layer 5 at one side of each of prepreg materials 2 preferably has a thickness t ranging from 5 μm to 30 μm.

a1(%): The ratio of the area of conductor patterns 3 to the area of surface 7a of insulating layer 7 of core material 1 a2(%): The ratio of the area of conductor patterns 32 to the area of surface 72a of insulating layer 72 of core material 12

In this case, the areas refer to the areas viewing in the thickness direction of core materials 1 and 12 (in a plan view). Particularly in the case that the materials of conductor patterns 3 and 32 are copper, the ratios a1 and a2 are referred to as remaining copper rates. Further, the value of the expression (1−a1/100) means the ratio of the area of gap 30 to the area of surface 7a of insulating layer 7 of core material 1, and the value of the expression (1−a2/100) means the ratio of the area of gap 320 to the area of surface 72a of insulating layer 72 in core material 12.

T1: The thickness of conductor pattern 3 (T1≥100 μm)
T2: The thickness of conductor pattern 32 (T2≥100 μm)

Similarly to Embodiment 2, the thicknesses of conductor patterns 3 and 32 are not smaller than 100 μm.

n: The number of prepreg material 2 (n≥2)

The number n of prepreg materials 2 is four in FIG. 3A, it is not particularly limited, as long as the relational expressions (2) to (4) are all satisfied.

Next, as illustrated in FIG. 3B, plural prepreg materials 2 are stacked on one another to form laminated body 210, such that one prepreg material 2 (102) out of plural prepreg materials 2 is provided on surface 7a of insulating layer 7 of core material 1 to cover conductor patterns 3, and such that another prepreg material 2 (202) out of plural prepreg materials 2 provided on surface 72a of insulating layer 72 of core material 12 to cover conductor patterns 32. Laminated body 210 constituted by core material 1, prepreg materials 2, and core material 12 is subjected to heating-and-pressing forming, providing wiring board 1002 illustrated in FIG. 3C. In this case, the forming conditions, such as a temperature and a pressure, are not particularly limited.

Resin layers 5 (105, 205) in the semi-cured state in prepreg materials 2 come into a molten state by the heating and pressing. Gap 30 between conductor patterns 3 may not be filled only with the resin of resin layer 5 of prepreg material 2 facing core material 1 adjacent to core material 1. Similarly, Gap 320 between conductor patterns 32 may not be filed only with the resin of resin layer 5 of prepreg material 2 facing core material 12 adjacent to core material 12. For coping therewith, according to Embodiment 2, glass cloths 4 of prepreg materials 2 have an opening ratio ranging from 3% to 15%. Thus, as indicated by arrows in FIG. 3B, the resin of resin layers 5 which do not face core material 1 can move toward core material 1 through openings 9 in glass cloths 4. Similarly, the resin of resin layers 5 which do not face core material 12 can move toward core material 12 through openings 9 in glass cloths 4. Thus, the resin required for filling gaps 30 between conductor patterns 3 can be supplied from resin layers 5 which do not face core material 1. Similarly, the resin required for filling gap 320 between conductor patterns 32 can be supplied from resin layers 5 which do not face core material 12. Further, in the case that it is impossible to overcome the shortage of the resin only with prepreg material 2 adjacent to core material 1 and with prepreg material 2 adjacent to core material 12, the resin can be supplied from prepreg materials 2 which are not adjacent to core material 1 and from prepreg materials 2 which are not adjacent to core material 12, as indicated by the arrows in FIG. 3B. Thus, gap 30 between conductor patterns 3 having a thickness T1 not smaller than 100 μm and gap 320 between conductor patterns 32 having a thickness T2 not smaller than 100 μm are filled with the resin while suppressing the occurrence of voids in gaps 30 and 320. Further, the resin of resin layers 5 which do not face core material 1 and the resin of resin layers 5 which do not face core material 12 can also fill gap 30 between conductor patterns 3 and gap 320 between conductor patterns 32, thus avoiding excessive increases of the amount of the resin in all prepreg materials 2, thereby inhibiting the protrusion of the resin from the periphery of laminated body 210 during the heating-and-pressing forming of laminated body 210.

The aforementioned relational expressions (2) and (3) indicate that gap 30 between conductor patterns 3 and gap 320 between conductor patterns 32 can not be filled only with the resin of the thickness t of resin layer 5 at one side of one prepreg material 2.

The aforementioned relational expression (4) indicates that gap 30 between conductor patterns 3 and gap 320 between conductor patterns 32 can not be filled with the resin of the sum (2·n·t) of the thicknesses of resin layers 5 at both sides of all used prepreg materials 2.

By satisfying all of the aforementioned relational expressions (2) to (4), it is possible to reduce the entire thickness of wiring board 1002, using prepreg materials 2 having a small thickness to such an extent that gap 30 between conductor patterns 3 cannot be filled with the resin of resin layer 5 at one side of prepreg material 2 adjacent to core material 1, and to such an extent that gap 320 between conductor patterns 32 cannot be filled with the resin of resin layer 5 at one side of prepreg material 2 adjacent to core material 12.

Particularly, glass cloths 4 of prepreg materials 2 preferably have a thickness ranging from 10 μm to 100 μm. Resin layer 5 at one side of prepreg material 2 preferably has thicknesses t ranging from 5 μm to 30 μm. Each of prepreg materials 2 has an entire thickness ranging from 20 μm to 160 μm. This structure effectively reduces the entire thickness of wiring board 1002.

FIG. 3C illustrates fabricated wiring board 1002 in which resin layers 5 in the semi-cured state in prepreg materials 2 are cured to form cured resin layer 50 having an insulating property. Conductor patterns 3 and 32 constitute inner-layer patterns inside cured resin layer 50. Patterns may be formed in metal foil 8 which is the outermost layer by, e.g. a subtractive method.

In wiring board 1002 illustrated in FIG. 3C, the distance to surface 7a of insulating layer 7 of core material 1 from glass cloth 4 (104) of one prepreg material 2 (102) out of plural prepreg materials 2 which is provided on core material 1 faces core material 1 is a thickness ta. The thickness ta is formed by one resin layer 5 (105), as illustrated in FIG.

3A. The distance to surface 72a of insulating layer 72 of core material 12 from glass cloth 4 (204) of one prepreg material 2 (202) out of plural prepreg materials 2 which is provided on core material 12 and which faces core material 12 is a thickness tc. The thickness tc is formed by one resin layer 5 (205), as illustrated in FIG. 3A. The distance between glass cloths 4 in plural prepreg materials 2 is a thickness tb. The thickness tb is formed by two insulating layers 5 (105, 205). After laminated body 210 is pressed, the thicknesses to and tc are both larger than a half of the thickness tb.

Samples of examples and comparative examples of wiring board 1002 according to Embodiment 2 were prepared and evaluated. The examples satisfy all of the opening ratio of glass cloths 4 ranging from 3% to 15%, and the relational expressions (2) to (4). The comparative examples do not satisfy at least one of the opening ratio of glass cloths 4 ranging from 3% to 15%, and the relational expressions (2) to (4).

EXAMPLE 1

Double-sided copper clad laminated plates ("R-1766" manufactured by Panasonic Corporation, layer structure: copper foil (having a thickness of 105 µm)/insulating layer (having a thickness of 0.2 mm)/copper foil (having a thickness of 105 µm)), patterns were formed on respective single surfaces thereof to provide a remaining copper rate of 50%, thereby providing core materials 1 and 12 having respective conductor patterns 3 and 32.

As prepreg materials 2, "R-1661GG" manufactured by Panasonic Corporation (the amount of resin: 69 weight %, glass cloth 4: "#1080" manufactured by Nitto Boseki Co., Ltd., opening ratio: 4.3%) was prepared.

Core material 1, three prepreg materials 2 (having a total thickness of 0.28 mm) and core material 12 were stacked in this order, and they were subjected to heating-and-pressing forming under temperature conditions: a temperature rise rate of 1.5° C./min, holding at a temperature not lower than 160° C. for 60 minutes, and a maximum temperature of 170° C., and under a pressure condition: 2.94 MPa (30 kgf/cm$^2$). Example 1 of wiring board 1002 was thus provided. Then, metal foils 8 and 82 as the outermost layers of wiring board 1002 were all removed by etching.

EXAMPLE 2

Core materials 1 and 12 were provided, similarly to Example 1.

As prepreg materials 2, the same members as those in Example 1 were prepared.

Core material 1, eight prepreg materials 2 (having a total thickness of 0.74 mm) and core material 12 were laminated in this order, and they were subjected to heating-and-pressing forming similarly to Example 1, thereby providing Example 2 of wiring board 1002. Then, metal foils 8 and 82 as the outermost layers of wiring board 1002 were entirely removed by etching

EXAMPLE 3

Core materials 1 and 12 were provided, similarly to Example 1.

As prepreg materials 2, "R-1661" manufactured by Panasonic Corporation (the amount of resin: 50 weight %, glass cloth 4: "#1080" manufactured by Nitto Boseki Co., Ltd., opening ratio: 4.3%) was prepared.

Core material 1, six prepreg materials 2 (having a total thickness of 0.45 mm) and core material 12 were stacked in this order, and they were subjected to heating-and-pressing forming similarly to Example 1, thereby providing Example 3 of wiring board 1002. Then, metal foils 8 and 82 as the outermost layers of wiring board 1002 were entirely removed by etching

EXAMPLE 4

Core materials 1and 12 were provided, similarly to Example 1.

As prepreg materials 2, the same members as those in Example 3 were prepared.

Core material 1, ten prepreg materials 2 (having a total thickness of 0.75 mm) and core material 12 were stacked in this order, and they were subjected to heating-and-pressing forming similarly to Example 1, thereby providing Example 3 of wiring board 1002. Then, metal foils 8 and 82 as the outermost layers of wiring board 1002 were entirely removed by etching

EXAMPLE 5

Core materials 1 and 12 were provided, similarly to Example 1.

As prepreg materials 2, "R-1661JK" manufactured by Panasonic Corporation (the amount of resin: 72 weight %, glass cloth 4: "#106" manufactured by Nitto Boseki Co., Ltd., opening ratio: 12.5%) was prepared.

Core material 1, fourteen prepreg materials 2 (having a total thickness of 0.76 mm) and core material 12 were stacked in this order, and they were subjected to heating-and-pressing forming similarly to Example 1, thereby providing Example 5 of wiring board 1002. Then, metal foils 8 and 82 as the outermost layers of wiring board 1002 were entirely removed by etching

EXAMPLE 6

Core materials 1 and 12 were provided, similarly to Example 1.

As prepreg materials 2, "R-1661" manufactured by Panasonic Corporation (the amount of resin: 85 weight %, glass cloth 4: "#106" manufactured by Nitto Boseki Co., Ltd., opening ratio: 12.5%) was prepared.

Core material 1, three prepreg materials 2 (having a total thickness of 0.22 mm) and core material 12 were stacked in this order, and they were subjected to heating-and-pressing forming similarly to Example 1, thereby providing Example 6 of wiring board 1002. Then, metal foils 8 and 82 as the outermost layers in wiring board 1002 were entirely removed by etching.

EXAMPLE 7

Core materials 1 and 12 were provided, similarly to Example 1.

As prepreg materials 2, the same members as those in Example 6 were prepared.

Core material 1, six prepreg materials 2 (having a total thickness of 0.45 mm) and core material 12 were stacked in this order, and they were subjected to heating-and-pressing forming similarly to Example 1, thereby providing Example 7 of wiring board 1002. Thereafter, metal foils 8 and 82 as the outermost layers in wiring board 1002 were entirely removed by etching

EXAMPLE 8

Core materials 1 and 12 were provided, similarly to Example 1.

As prepreg materials 2, the same members as those in Example 6 were prepared.

Core material 1, ten prepreg materials 2 (having a total thickness of 0.73 mm) and core material 12 were stacked in this order, and they were subjected to heating-and-pressing forming similarly to Example 1, thereby providing Example 8 of wiring board 1002. Then, metal foils 8 and 82 as the outermost layers in wiring board 1002 were entirely removed by etching.

COMPARATIVE EXAMPLE 1

Core materials 1 and 12 were provided, similarly to Example 1.

As prepreg materials 2, "R-1661GG" manufactured by Panasonic Corporation (the amount of resin: 52 weight %, glass cloth 4: "#7628" manufactured by Nitto Boseki Co., Ltd., opening ratio: 0.6%) was prepared.

Core material 1, one prepreg material 2 (having a total thickness of 0.24 mm) and core material 12 were stacked in this order, and they were subjected to heating-and-pressing forming similarly to Example 1, thereby providing Comparative Example 1 of the wiring board. Then, metal foils 8, 82 as the outermost layers in the wiring board were entirely removed by etching

COMPARATIVE EXAMPLE 2

Core materials 1 and 12 were provided, similarly to Example 1.

As prepreg materials 2, the same members as those in Comparative Example 1 were prepared.

Core material 1, two prepreg materials 2 (having a total thickness of 0.48 mm) and core material 12 were stacked in this order, and they were subjected to heating-and-pressing forming similarly to Example 1, thereby providing Comparative Example 2 of the wiring board. Then, metal foils 8, 82 as the outermost layers in the wiring board were entirely removed by etching

COMPARATIVE EXAMPLE 3

Core materials 1 and 12 were provided, similarly to Example 1.

As prepreg materials 2, the same members as those in Comparative Example 1 were prepared.

Core material 1, three prepreg materials 2 (having a total thickness of 0.73 mm) and core material 12 were stacked in this order, and they were subjected to heating-and-pressing forming similarly to Example 1, thereby providing Comparative Example 3 of the wiring board. Then, metal foils 8, 82 as the outermost layers in the wiring board were entirely removed by etching

COMPARATIVE EXAMPLE 4

Core materials 1 and 12 were provided, similarly to Example 1.

As prepreg materials 2, "R-1661JR" manufactured by Panasonic Corporation (amount of resin: 60 weight %, glass cloth 4: "#2116" manufactured by Nitto Boseki Co., Ltd., opening ratio: 1.5%) was prepared.

Core material 1, two prepreg materials 2 (having a total thickness of 0.31 mm) and core material 12 were stacked in this order, and they were subjected to heating-and-pressing forming similarly to Example 1, thereby providing Comparative Example 4 of the wiring board. Then, metal foils 8, 82 as the outermost layers in the wiring board were entirely removed by etching

COMPARATIVE EXAMPLE 5

Core materials 1 and 12 were provided, similarly to Example 1.

As prepreg materials 2, the same members as those in Comparative Example 4 were prepared.

Core material 1, three prepreg materials 2 (having a total thickness of 0.47 mm) and core material 12 were stacked in this order, and they were subjected to heating-and-pressing forming similarly to Example 1, thereby providing Comparative Example 5 of the wiring board. Then, metal foils 8 and 82 as the outermost layers of the wiring board were entirely removed by etching

COMPARATIVE EXAMPLE 6

Core materials 1 and 12 were provided, similarly to Example 1.

As prepreg materials 2, the same members as those in Comparative Example 3 were prepared.

Core material 1, five prepreg materials 2 (having a total thickness of 0.77 mm) and core material 12 were stacked in this order, and they were subjected to heating-and-pressing forming similarly to Example 1, thereby providing Comparative Example 6 of the wiring board. Then, metal foils 8 and 82 as the outermost layers in the wiring board were entirely removed by etching

COMPARATIVE EXAMPLE 7

Core materials 1 and 12 were provided, similarly to Example 1.

As prepreg materials 2, the same members as those in Example 3 were prepared.

Core material 1, two prepreg materials 2 (having a total thickness of 0.15 mm) and core material 12 were stacked in this order, and they were subjected to heating-and-pressing forming similarly to Example 1, thereby providing Comparative Example 7 of the wiring board. Then, metal foils 8 and 82 as the outermost layers in the wiring board were entirely removed by etching FIGS. 4A and 4B illustrate the results of visually observing cross sections of the samples of the examples and comparative examples for checking the presence or absence of voids therein.

Further, no protrusion of the resin was found during the heating-and-pressing forming, in the examples and comparative examples.

As shown in FIGS. 4A and 4B, it is revealed that voids occurred in the comparative examples while it was possible to suppress the occurrence of voids in the examples.

REFERENCE MARKS IN THE DRAWINGS

1 core material (first core material)
2 prepreg material
3 conductor pattern (first conductor pattern)
4 glass cloth
5, 105, 205 resin layer (first resin layer, second resin layer)

7 insulating layer (first insulating layer)
12 core material (second core material)
32 conductor pattern (second conductor pattern)
72 insulating layer (second resin layer)

The invention claimed is:

1. A method for fabricating a wiring board, comprising:
preparing a core material including an insulating layer and a conductor pattern provided on a surface of the insulating layer;
preparing one or more prepreg materials each including a glass cloth having a first surface and a second surface opposite to the first surface, a first resin layer covering the first surface of the glass cloth, and a second resin layer covering the second surface of the glass cloth, the first resin layer and the second resin layer each having a thickness t, and being made of a semi-cured resin with which the glass cloth is impregnated;
forming a laminated body by placing the one or more prepreg materials on one another, such that one prepreg material out of the one or more prepreg materials is provided on the surface of the insulating layer of the core material to cover the conductor pattern; and
heating and pressing the laminated body;
wherein the glass cloth has an opening ratio ranging from 3% to 15%, and
wherein the thickness t of the first resin layer and the second resin layer, a ratio a (%) of an area of the conductor pattern to an area of the surface of the insulating layer of the core material, a thickness T of the conductor pattern, and the number n of each of the one or more prepreg materials satisfy the relationships:

$T \geq 100 (\mu m)$; and $t < (1-a/100) \cdot T < 2 \cdot n \cdot t$.

2. The method according to claim 1,
wherein the glass cloth has a thickness ranging from 10 μm to 100 μm,
wherein the thickness t of the first resin layer and the second resin layer ranges from 5 μm to 30 μm, and
wherein each of the one or more prepreg materials has a thickness ranging from 20 μm to 160 μm.

3. The method according to claim 1, wherein a ratio of an amount of the resin in each of the one or more prepreg materials ranges from 50 weight % to 85 weight %.

4. A method for fabricating a wiring board, comprising:
preparing a first core material including a first insulating layer and a first conductor pattern provided on a surface of the first insulating layer;
preparing a second core material including a second insulating layer and a second conductor pattern provided on a surface of the second insulating layer;
preparing a plurality of prepreg materials each including a glass cloth having a first surface and a second surface opposite to the first surface, a first resin layer covering the first surface of the glass cloth, and a second resin layer covering the second surface of the glass cloth, each of the first resin layer and the second resin layer each having a thickness t, and made of a semi-cured resin with which the glass cloth is impregnated;
forming a laminated body by placing the plurality of prepreg materials on one another, such that one prepreg material out of the plurality of prepreg materials is provided on the surface of the insulating layer of the first core material to cover the first conductor pattern, and, another prepreg material out of the plurality of prepreg materials is provided on the surface of the second insulating layer of the second core material to cover the second conductor pattern; and
heating and pressing the laminated body;
wherein the glass cloth has an opening ratio ranging from 3% to 15%,
wherein the thickness t of each of the first resin layer and the second resin layer, a ratio a1 (%) of an area of the first conductor pattern to an area of the surface of the first core material, a ratio a2 (%) of an area of the second conductor pattern to an area of the surface of the second core material, a thickness T1 of the first conductor pattern, a thickness T2 of the second conductor pattern, and the number n of the plurality of prepreg materials satisfy the relationships:

$T1 \geq 100 (\mu m)$;

$T2 \geq 100 (\mu m)$;

$t < (1-a1/100)T1$;

$t < (1-a2/100)T2$; and $(1-a1/100) \cdot T1 + (1-a2/100) \cdot T2 < 2 \cdot n \cdot t$.

5. The method according to claim 4,
wherein the glass cloth has a thickness ranging from 10 μm to 100 μm,
wherein the thickness t of each of the first resin layer and the second resin layer ranges from 5 μm to 30 μm, and
wherein each of the prepreg materials has a thickness ranging from 20 μm to 160 μm.

6. The method according to claim 4, wherein a ratio of an amount of the resin of each of the plurality of prepreg materials ranges from 50 weight % to 85 weight %.

* * * * *